United States Patent
Hu (10) Patent No.: US 10,256,116 B2
(45) Date of Patent: Apr. 9, 2019

(54) PROCESS FOR PACKAGING CIRCUIT COMPONENT HAVING COPPER CIRCUITS WITH SOLID ELECTRICAL AND THERMAL CONDUCTIVITIES AND CIRCUIT COMPONENT THEREOF

(71) Applicant: Chih-liang Hu, Taipei (TW)

(72) Inventor: Chih-liang Hu, Taipei (TW)

(*) Notice: Subject to any disclaimer, the term of this patent is extended or adjusted under 35 U.S.C. 154(b) by 0 days.

(21) Appl. No.: 15/474,332

(22) Filed: Mar. 30, 2017

(65) Prior Publication Data
US 2017/0287729 A1 Oct. 5, 2017

(30) Foreign Application Priority Data
Mar. 30, 2016 (TW) .............................. 105110137 A (51) Int. Cl.
*H01L 21/48* (2006.01)
*H01L 23/14* (2006.01)
(Continued)

(52) U.S. Cl.
CPC ........ *H01L 21/486* (2013.01); *H01L 21/4817* (2013.01); *H01L 21/4867* (2013.01);
(Continued)

(58) Field of Classification Search
CPC ............. H01L 21/4814; H01L 21/4846; H01L 21/486; H01L 21/56; H01L 21/4878;
(Continued)

(56) References Cited

U.S. PATENT DOCUMENTS

| 7,632,747 B2* | 12/2009 | Johnson | H01L 21/4857 257/E21.575 |
| 2006/0278989 A1* | 12/2006 | Trezza | H01L 21/6835 257/773 |

(Continued)

*Primary Examiner* — Joseph C. Nicely
(74) *Attorney, Agent, or Firm* — Arent Fox LLP (57) ABSTRACT

A method for packaging a circuit component, comprising: forming a first protruding pad on a first copper substrate and a through-hole in the first protruding pad; forming a second protruding pad on a second copper substrate and placing a circuit dice of the circuit component on the second protruding pad having a conductive paste coated thereon wherein a first electrode of the dice facing the second protruding pad; stacking the first copper substrate onto the second copper substrate with the first protruding pad having a conductive paste coated thereon aligned and pressing onto the circuit dice placed on the second protruding pad wherein a second electrode of the dice facing the first protruding pad; inserting a copper rod tightly into the through-hole until contacting with a conductive paste coated on the second substrate; heat-treating the stacked structure for the circuit dice and the copper rod to form secured electrical connection with the first and second copper substrates respectively and further forming a hermetic seal in the space between the first and second copper substrates; and using the hermetic seal as a rigid processing structure, etching the exposed surface of the first and second copper substrates to remove the entire thickness of copper other than in the area of the first and second protruding pads and in the area other than where the copper rod connects to the second copper substrate, thereby forming the device terminals of the circuit component package.

5 Claims, 14 Drawing Sheets

(51) Int. Cl.
*H01L 23/049* (2006.01)
*H01L 23/18* (2006.01)
*H01L 21/56* (2006.01)
*H01L 23/482* (2006.01)
*H01L 23/498* (2006.01)
*H01L 23/051* (2006.01)
*H01L 23/31* (2006.01)

(52) U.S. Cl.
CPC ...... *H01L 21/4875* (2013.01); *H01L 21/4878* (2013.01); *H01L 21/56* (2013.01); *H01L 23/049* (2013.01); *H01L 23/051* (2013.01); *H01L 23/14* (2013.01); *H01L 23/18* (2013.01); *H01L 23/4827* (2013.01); *H01L 23/49811* (2013.01); *H01L 23/49827* (2013.01); *H01L 23/3107* (2013.01); *H01L 23/3135* (2013.01); *H01L 2224/32245* (2013.01); *H01L 2224/33181* (2013.01); *H01L 2224/97* (2013.01)

(58) Field of Classification Search
CPC ............. H01L 21/4875; H01L 21/4867; H01L 21/4817; H01L 23/051; H01L 23/49827; H01L 23/4827; H01L 23/49811; H01L 23/3107; H01L 23/049; H01L 23/18; H01L 23/14
See application file for complete search history.

(56) References Cited

U.S. PATENT DOCUMENTS

| | | | |
|---|---|---|---|
| 2010/0187670 A1* | 7/2010 | Lin | H01L 21/76898 257/686 |
| 2013/0134593 A1* | 5/2013 | Machida | H01L 23/528 257/772 |
| 2013/0234318 A1* | 9/2013 | Lee | H01L 24/81 257/737 |
| 2014/0001619 A1* | 1/2014 | Yoo | H01L 24/96 257/676 |
| 2014/0167237 A1* | 6/2014 | Yoo | H01L 24/73 257/676 |
| 2014/0306350 A1* | 10/2014 | Urruti | H01L 21/76802 257/774 |
| 2016/0027711 A1* | 1/2016 | Harada | H01L 25/07 257/698 |
| 2016/0268228 A1* | 9/2016 | Hu | H01L 24/97 |
| 2017/0170030 A1* | 6/2017 | Iruvanti | H01L 21/4853 |

* cited by examiner

PROCESS FOR PACKAGING CIRCUIT COMPONENT HAVING COPPER CIRCUITS WITH SOLID ELECTRICAL AND THERMAL CONDUCTIVITIES AND CIRCUIT COMPONENT THEREOF

CROSS REFERENCE TO RELATED APPLICATION

This application claims the benefit of priority to Taiwanese Patent Application No. 105110137, filed Mar. 30, 2016. The disclosure of the prior application is hereby incorporated in its entirety by reference.

FIELD OF THE INVENTION

The present invention generally relates to semiconductor circuit component packages and a method for manufacturing such packages and, in particular, to surface mount device packages with good heat dissipation suitable for high power application and a corresponding method for manufacturing such packages. The present invention further relates to a process for packaging circuit component having copper circuits with solid electrical and thermal conductivities and packages thereof.

BACKGROUND OF THE INVENTION

It is known that surface mount packages of discrete circuit components for such as diodes, light emitting diodes and thyristors are commonly found in the form of, for example, (1) glass tube/plastic packages, (2) lead-frame-based leaded packages, (3) flat-pack leadless packages, and (4) flip-chip packages.

Among these common packages, flip-chip package is advantageously characterized by its light weight and compactness. However, its packaging is expensive. Flip-chip discrete components are currently a step away from commercialization also due to their difficulties in handling as well as poor reliability and short service life. The other three forms of packaging, by comparison, are dominant in the market of power-type packages. However, as the trend is toward better electrical performance and higher power, intrinsic problems of these components have arisen from insufficient structural thermal conductivity and the resultant high temperature that these packaging technologies are reaching their limitations. Other disadvantages to overcome include increased costs and technical difficulties in their packaging procedures and materials because of regulatory compliance with environmental regulations.

For surface mount, matured pick-and-place techniques for these packaging forms are available for mass production of leaded/leadless discrete circuit components. It is production yield, automation, and cost in connection with manufacturing of such discrete circuit components that have proved to be main issue for manufacturers. Among those issues, how to improve the heat dissipation performance of these packaged components is to be addressed with priority.

SUMMARY OF THE INVENTION

It is therefore an object of the invention to provide a streamlined fabrication of discrete circuit components as well as improved electrical characteristics (such as current, power, and aging characteristics), mechanical properties, and heat dissipation of these components.

It is another object of the invention to provide a process for packaging discrete circuit components that can simplify the fabrication procedures, improve automation and increase production yield, and therefore lowers the costs for manufacturing discrete circuit components.

It is yet another object of the invention to provide a selection of materials used in discrete circuit component packaging that are better compliant with environmental regulations, including the Restriction of Hazardous Substance Directive (RoHS), Halogen Free, and the Waste Electronics and Electrical Equipment Directive (WEEE). The selection of such materials also focuses on thermal conductive materials and their electrical and electro-thermal effects in eutectic bonding in order to bring about high quality and extended life for the components.

According to one aspect of the present invention, a method for packaging a circuit component, comprising: forming a first protruding pad on a first copper substrate and a through-hole in the first protruding pad; forming a second protruding pad on a second copper substrate and placing a circuit dice of the circuit component on the second protruding pad having a conductive paste coated thereon wherein a first electrode of the dice facing the second protruding pad; stacking the first copper substrate onto the second copper substrate with the first protruding pad having a conductive paste coated thereon aligned and pressing onto the circuit dice placed on the second protruding pad wherein a second electrode of the dice facing the first protruding pad; inserting a copper rod tightly into the through-hole until contacting with a conductive paste coated on the second substrate; heat-treating the stacked structure for the circuit dice and the copper rod to form secured electrical connection with the first and second copper substrates respectively and further forming a hermetic seal in the space between the first and second copper substrates; and using the hermetic seal as a rigid processing structure, etching the exposed surface of the first and second copper substrates to remove the entire thickness of copper other than in the area of the first and second protruding pads and in the area other than where the copper rod connects to the second copper substrate, thereby forming the device terminals of the circuit component package.

According to another aspect of the present invention, a method for packaging a circuit component, comprising: forming a first protruding pad on a first copper substrate; forming a second protruding pad on a second copper substrate and placing a circuit dice of the circuit component on the second protruding pad having a conductive paste coated thereon wherein a first electrode of the dice facing the second protruding pad; placing a copper block on the second copper substrate at a position beside where the dice is placed and having a conductive paste coated thereon; stacking the first copper substrate onto the second copper substrate with the first protruding pad having a conductive paste coated thereon aligned and pressing onto the circuit dice and the copper block wherein a second electrode of the dice facing the first protruding pad; heat-treating the stacked structure for the circuit dice and the copper block to form secured electrical connection with the first and second copper substrates respectively and further forming a hermetic seal in the space between the first and second copper substrates; and using the hermetic seal as a rigid processing structure, etching the exposed surface of the first and second copper substrates to remove the entire thickness of copper other than in the area of the first and second protruding pads and in the area other than where the copper block connects to the second copper substrate, thereby forming the device terminals of the circuit component package.

BRIEF DESCRIPTION OF THE DRAWINGS

FIG. 1-1 is a schematic top view of a copper substrate structure used in a method according to the present invention, and FIG. 1-2 is a schematic cross-sectional view along the line a-a' crossing the copper substrate structure of FIG. 1-1.

FIG. 1-3 is a schematic perspective view of the copper substrate structure of FIG. 1-1.

FIG. 1-4 is a schematic perspective view of the copper substrate structure of FIG. 1-2.

FIGS. 2-1 and 2-2 are schematic top and cross-sectional views of another copper substrate structure used in the method according to the present invention.

FIGS. 6-1 and 6-2 are schematic cross-sectional and bottom views of a finished single circuit component package after being separated by cutting.

FIGS. 7-1 and 7-2 are schematic cross-sectional and bottom views of a finished circuit component package with two coupled circuit dices that can be used in the present invention.

DETAILED DESCRIPTION

Figure 11:
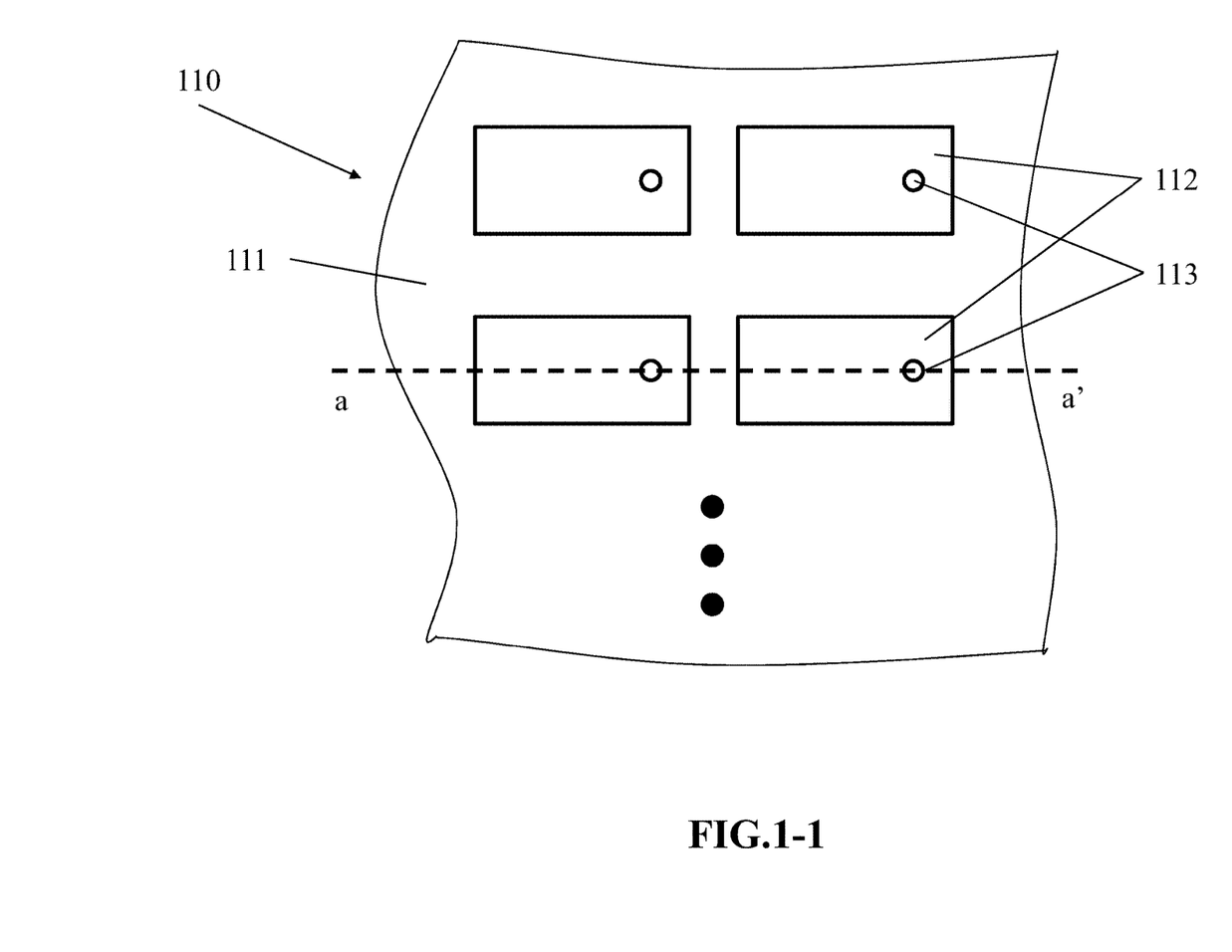
Figure 12:
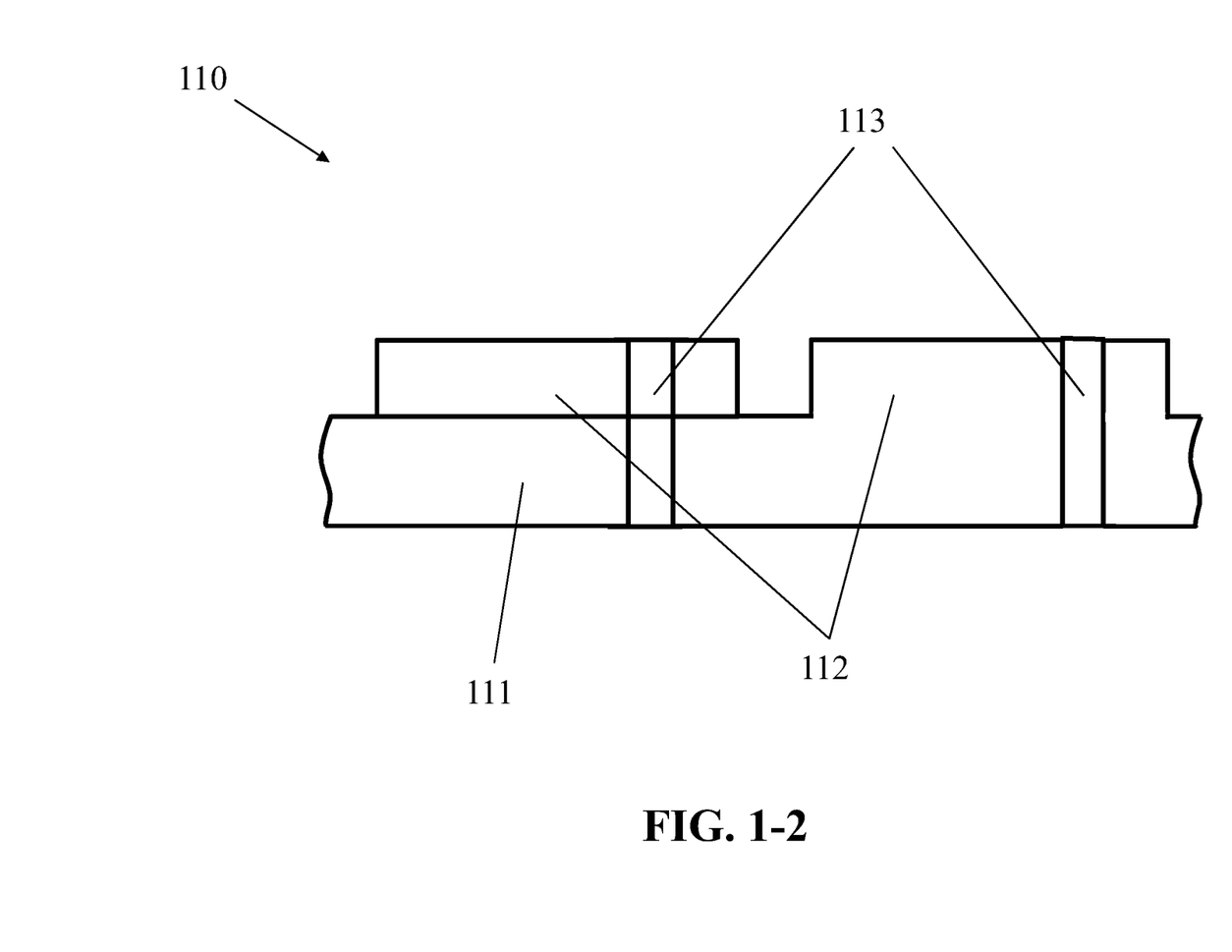
Figure 13:
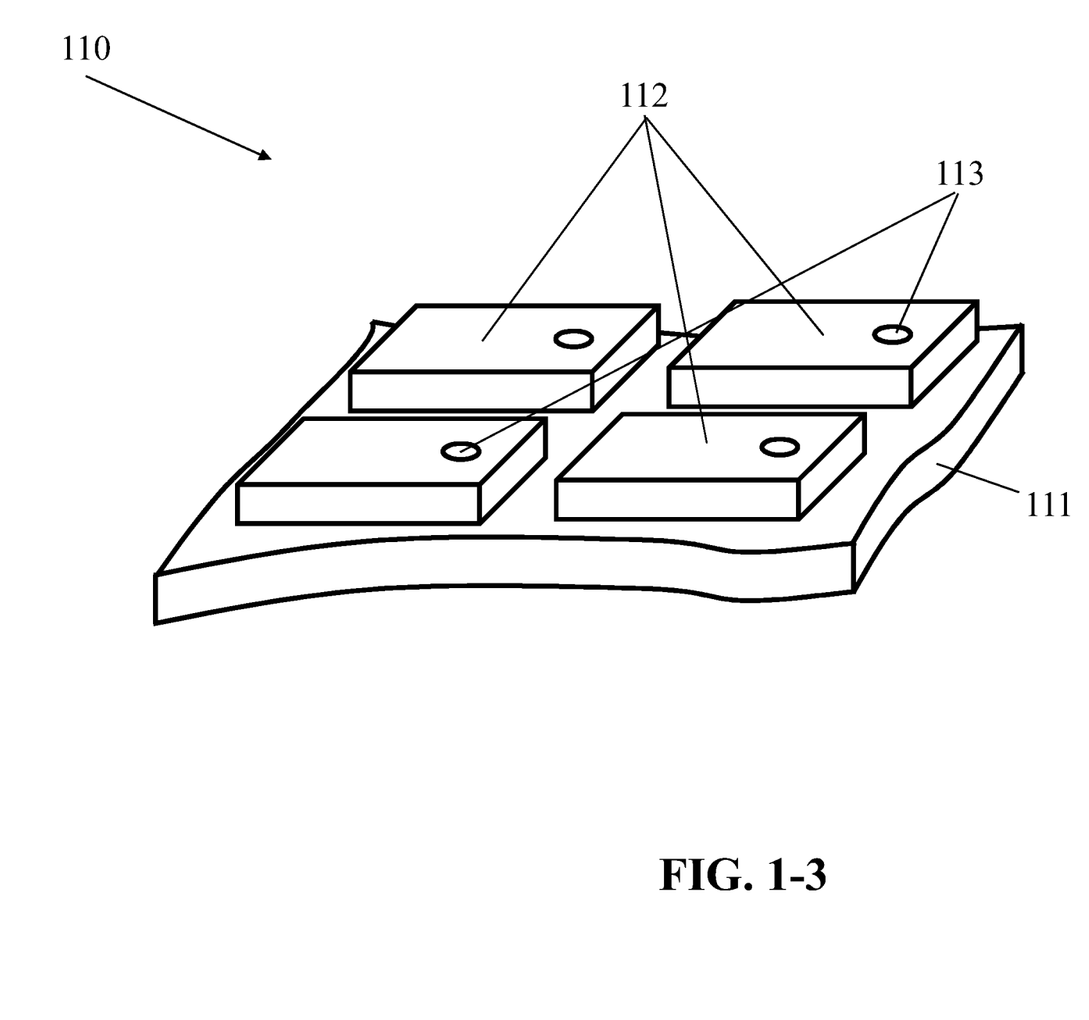

According to a preferred embodiment of the present invention, as shown in FIG. 1-1, a first copper substrate 111 is provided with an array of protruding pads 112 formed thereon by, for example, etching, electroplating, or electroless plating. Then, an array of through-holes 113 are formed at selected locations on the protruding pads 112 by, for example, etching or mechanical drilling. FIG. 1-2 is a schematic cross-sectional view along the line a-a' crossing the first copper substrate structure 110 of FIG. 1-1.

Figure 21:
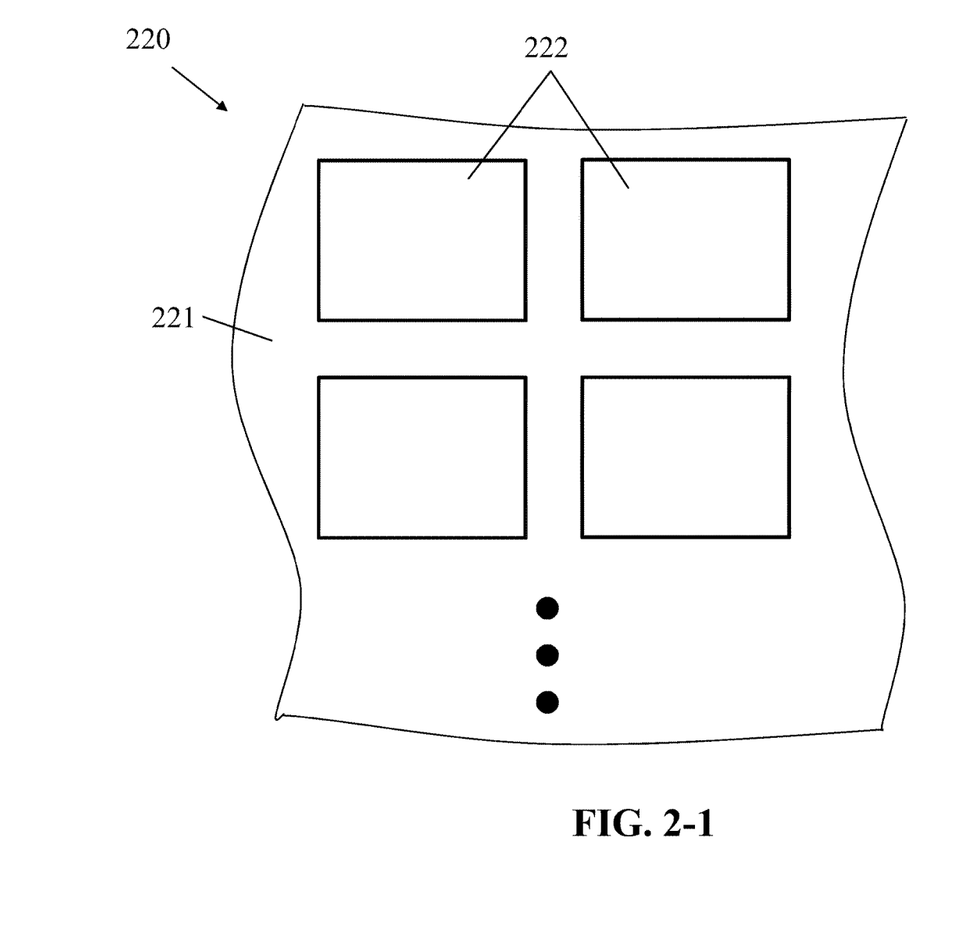
Figure 22:
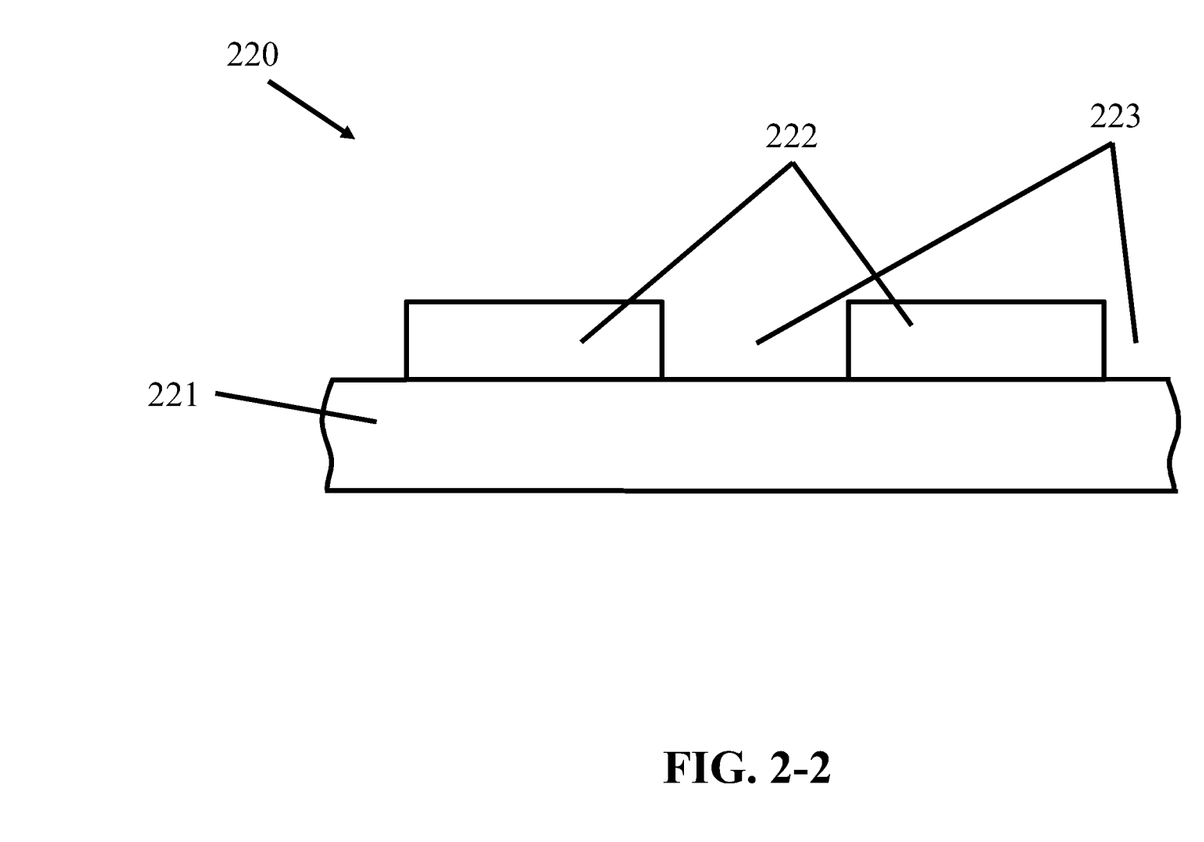

FIGS. 2-1 and 2-2 are schematic top and cross-sectional views of a second copper substrate 221 used in the embodiment according to the present invention. The second copper substrate structure 220 may be formed by, for example, subtractive manufacturing, where a second copper substrate 221 of a proper thickness is provided, and then portions of copper material 223 shown in FIG. 2-2 are etched away by, for example, surface etching. Alternatively, the second copper substrate structure 220 may be formed by, for example, additive manufacturing, where protruding pads 222 are formed on the surface of the second copper substrate 221 by, for example, copper plating. Either subtractive or additive manufacturing may be used to form an array of the protruding pads 222 shown in FIGS. 2-1 and 2-2.

By way of example, FIG. 1-3 is a schematic perspective view of the copper substrate structure of FIG. 1-1, and FIG. 1-4 is a schematic perspective view of the copper substrate structure of FIG. 1-2. It should be noted that FIGS. 1-2 and 1-4 clearly show that the protruding pads 112 on the upper left side of the first copper substrate 111 is formed by additive manufacturing such as electroplating, which is illustrated by the contact interface between the upper protruding pads 112 on the left side and the underlying first copper substrate 111. On the other hand, the protruding pads 112 on the upper right side of the first copper substrate 111 are formed by subtractive manufacturing such as etching (that is, the removed portions of copper material 223 in FIG. 2-2), which is illustrated by the integral structure of the upper protruding pads 112 on the right side and the underlying first copper substrate 111.

Figure 3:
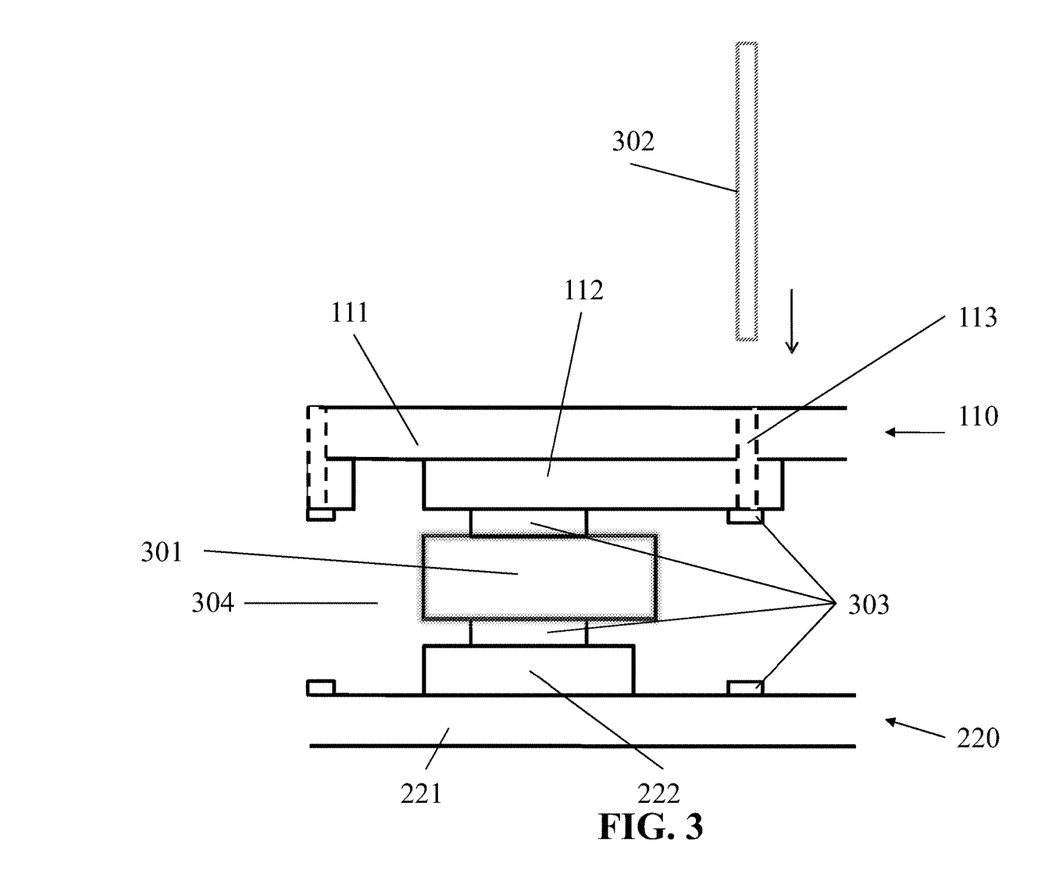
FIG. 3 is a schematic cross-sectional view illustrating the align-fitting of the two copper substrate structures relative to each other, followed by injection of a hermetic sealant into the space between the two copper substrate structures.

FIG. 3 schematically illustrates the steps of applying an conductive paste. First, dispense or print an conductive paste 303 in appropriate amount at predetermined locations on the first and second protruding pads 112, 222 of the copper substrate structures 110, 220. Suitable conductive pastes may be a paste of tin or lead and can also be a conductive paste of silver, aluminum, antimony, gold, nickel, copper, bismuth, or alloys thereof. Then, circuit dice 301 may be arranged and positioned in sequence at the locations printed with the conductive paste 303 on the second copper substrate structure 220 through a die bonding step employing pick-and-place procedures. Then, position and align the first copper substrate structure 110 printed with the conductive paste 303 with respect to the second copper substrate structure 220 to which the circuit dice 301 has been bonded. Then, insert copper rods 302 of proper size into the through-holes 113 already formed in the first copper substrate structure 110 until the copper rods 302 are in contact with the second copper substrate 221 of the second copper substrate structure 220.

It should be noted that although the through-holes 113 shown in FIGS. 1-1 to 1-4 have a cross section in circular form, cross sections in other polygonal forms such as rectangular and trapezoid forms are also applicable.

After the aligning of the copper substrate structures and insertion of the copper rods as described above, the aligned and coupled structures may be subjected to a soldering furnace or high-temperature baking process in order to complete the electrical connection at the two ends of the circuit dice 301. Alternatively, the electrical connection between the circuit dice 301 and the first copper substrate structure 110 may be formed first, and then the first copper substrate structure 110 may be aligned with the second copper substrate structure 220, and then the copper rods 302 may be inserted, followed by the high-temperature treatment for electrical connection between the circuit dice 301 and the second copper substrate structure 220. Namely, an electrical connection between the first and second copper substrate structures 110, 220, the copper rods 302, and the circuit dice 301 is established. Then, inject a viscous hermetic sealant 304 (for example, an insulating material of silicide, oxide, glass, epoxy resin, or 2-polyimide) into the space between the first and second copper substrate structure 110, 220, and then subject the structure of FIG. 3 to a high-temperature curing process to obtain a hermetic protection surrounding the circuit dice 301.

Figure 4:
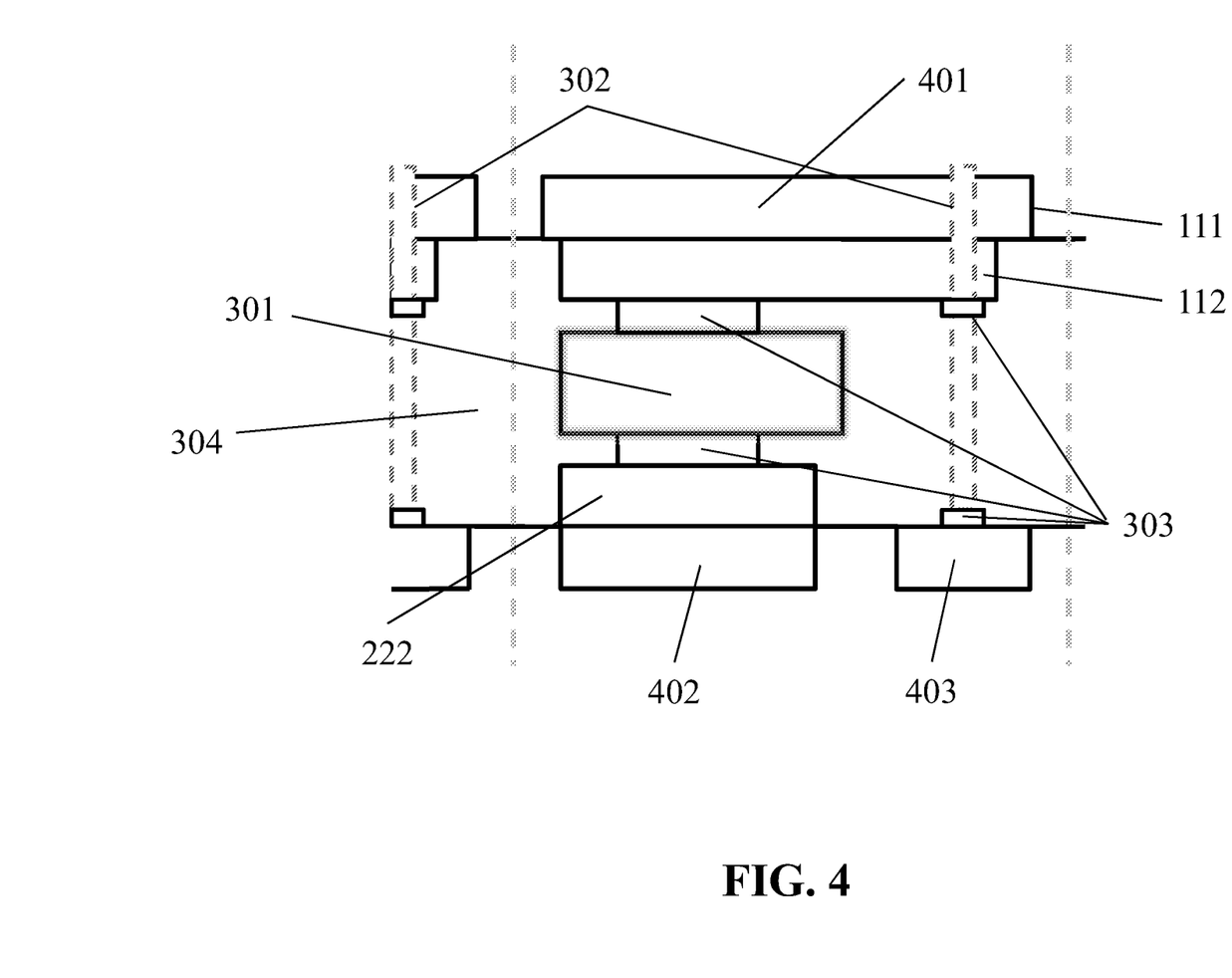
FIG. 4 is a schematic cross-sectional view illustrating insertion of copper rods between the two copper substrate structures and forming of external copper bumps on the two copper substrate structures.

Afterwards, apply a layer of photosensitive emulsion to the exposed surfaces of the first and second copper substrate structures 110, 220, and then subject the structure to exposure, development, etching, and cleaning processes to obtain independent copper bumps 401, 402, 403, as shown in FIG. 4. At this stage, a stacked structure with the electrical connection of the circuit dice 301 established and the hermetic protection surrounding the circuit dice 301 completed is obtained as shown in FIG. 4.

Figure 5:
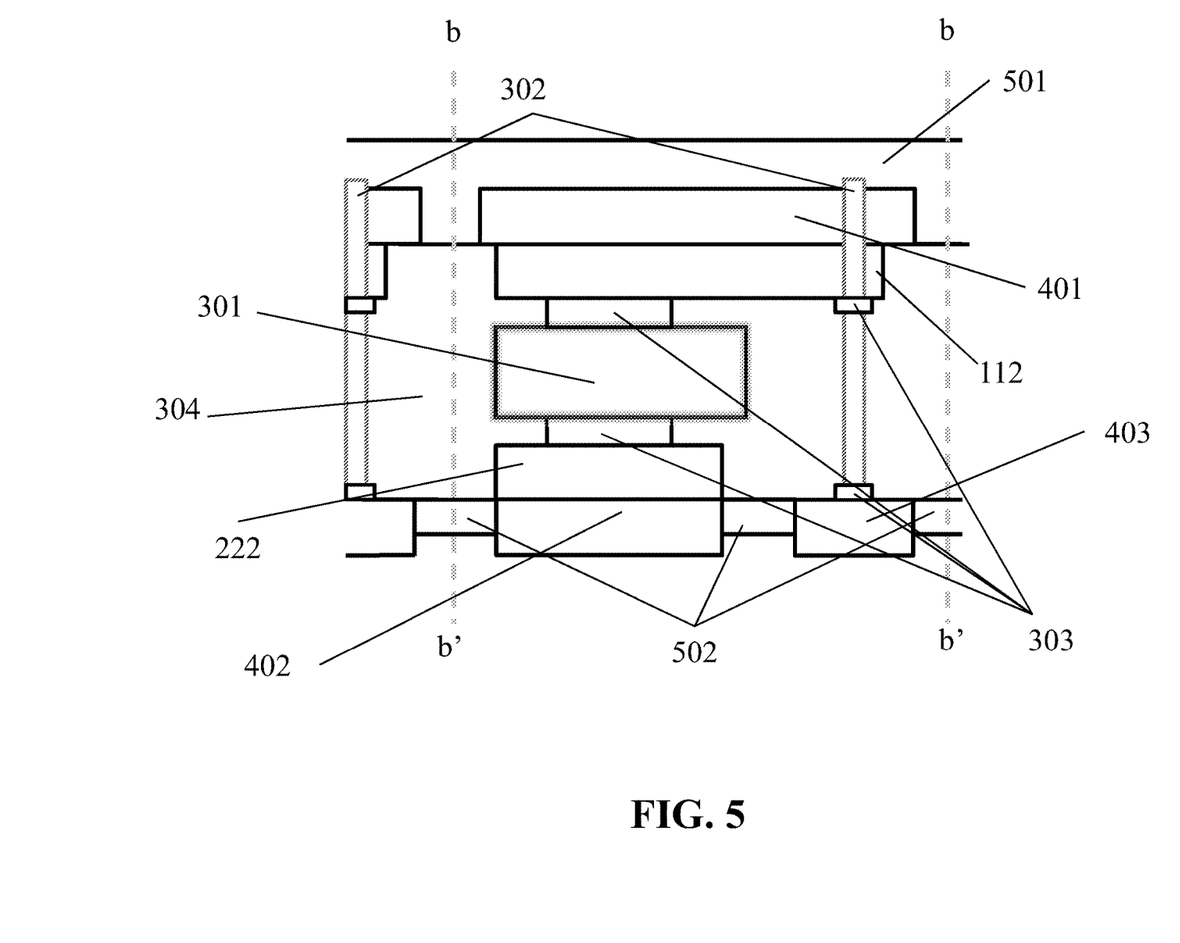
FIG. 5 is a schematic cross-sectional view illustrating injection of a hermetic sealant for the protection of the external copper bumps of the two copper substrate structures.

Refer to FIG. 5, a hermetic sealant (for example, an insulating material of silicide, oxide, glass, epoxy resin, or 2-polyimide) is injected over or between the independent copper bumps 401, 402, 403 of the fitted first and second copper structures 110, 220, and then the structure of FIG. 5 is subjected to a high-temperature curing process to form hermetic protections 501, 502. Next, the structure of FIG. 5 is cut along the line b-b' with, for example, a diamond cutter, a laser cutter, or a wire cutter, to separate each circuit component. At this stage, a discrete circuit component is obtained.

Figure 61:
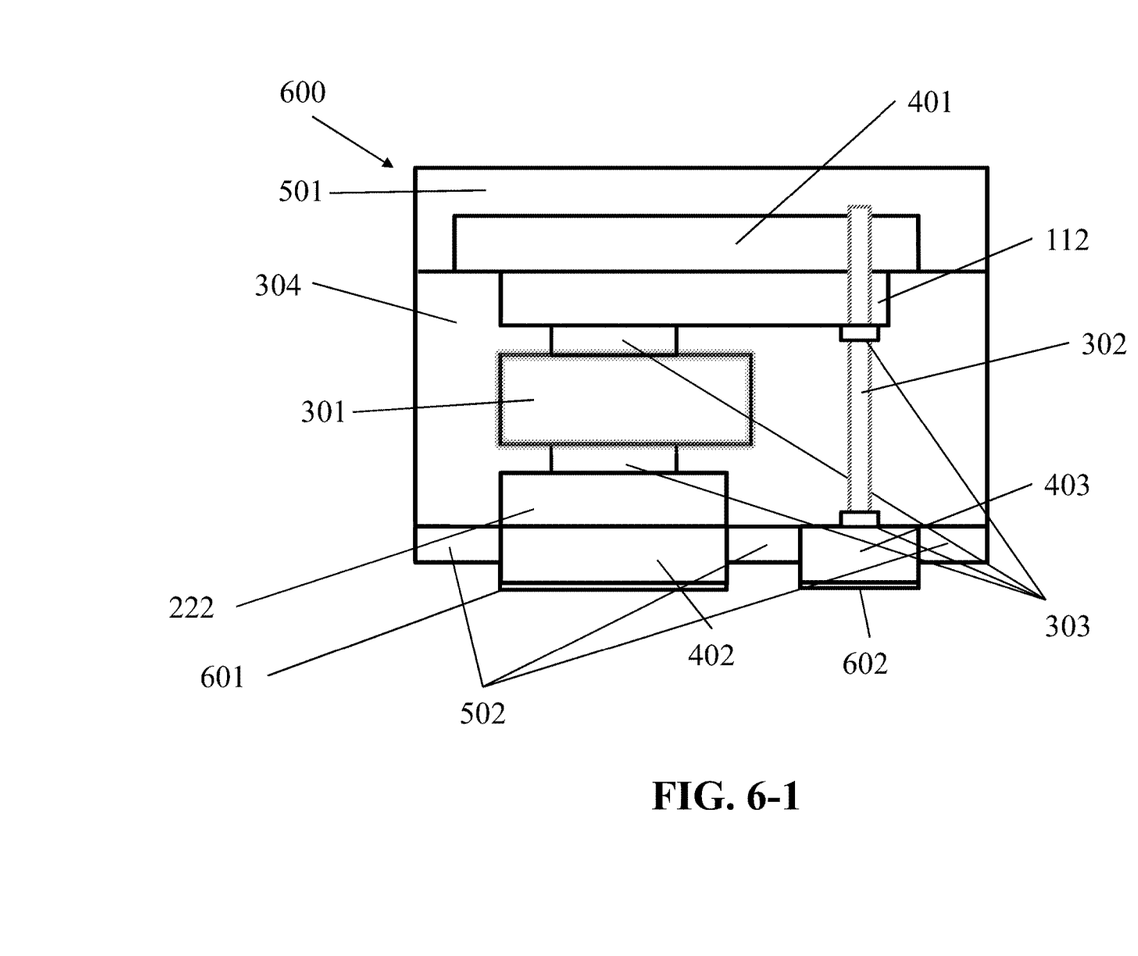
Figure 62:
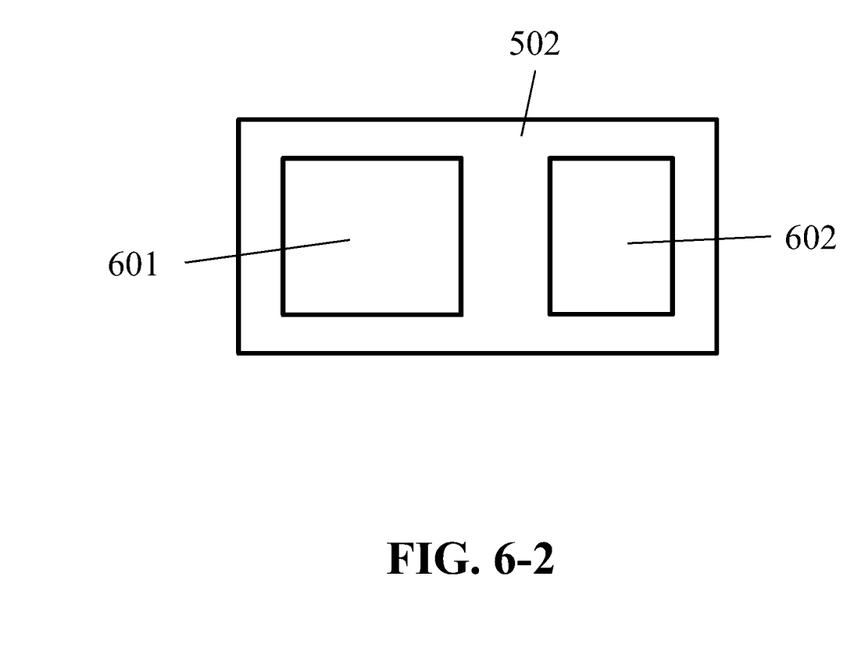

The discrete circuit component may be subject to a roller plating process to form the coating of the device terminals. The composition of the coating may comprise nickel, tin, lead, silver, gold, copper, aluminum, platinum, or alloys thereof. FIG. 6-1 is a cross-sectional view of the discrete circuit component package 600, and FIG. 6-2 is the bottom view of the device terminals of the package 600.

FIGS. 6-1, 6-2 schematically illustrate a preferred embodiment of a circuit component package manufactured according to the method of the present invention. Such a circuit component of high heat dissipation and high electric power may use diode dies with top and bottom electrodes as its circuit dice. Those in the art will understand that with respect to the discrete circuit component packages of the present invention described above, the useful circuit dice are not limited to diodes. For example, light emitting diodes, transistors, and thyristors may also be useful in the present invention. Also, the various features illustrated in the drawings accompanying the detailed description may not be drawn to the exact scale. Some dimensions of the views may be exaggerated for clarity.

Figure 71:
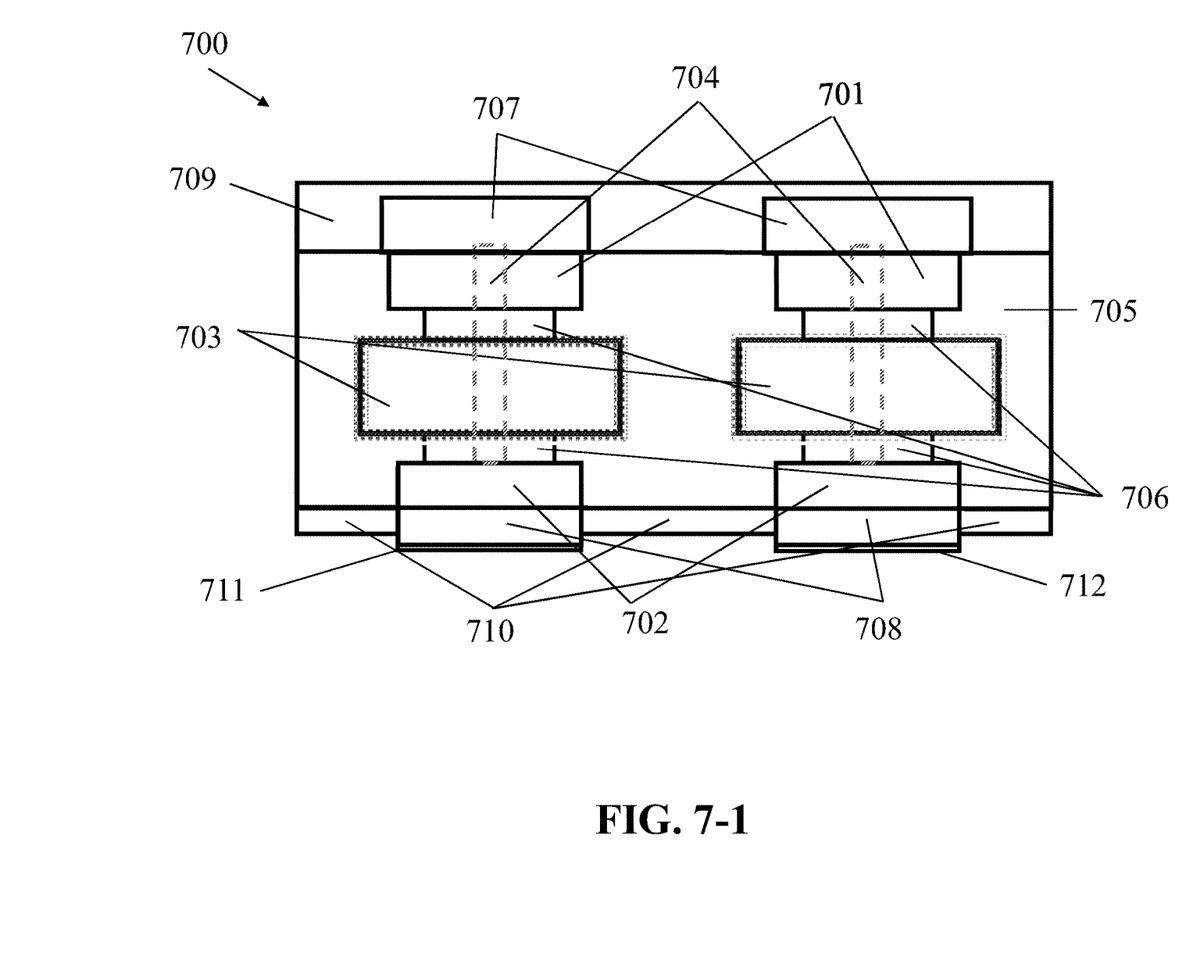
Figure 72:
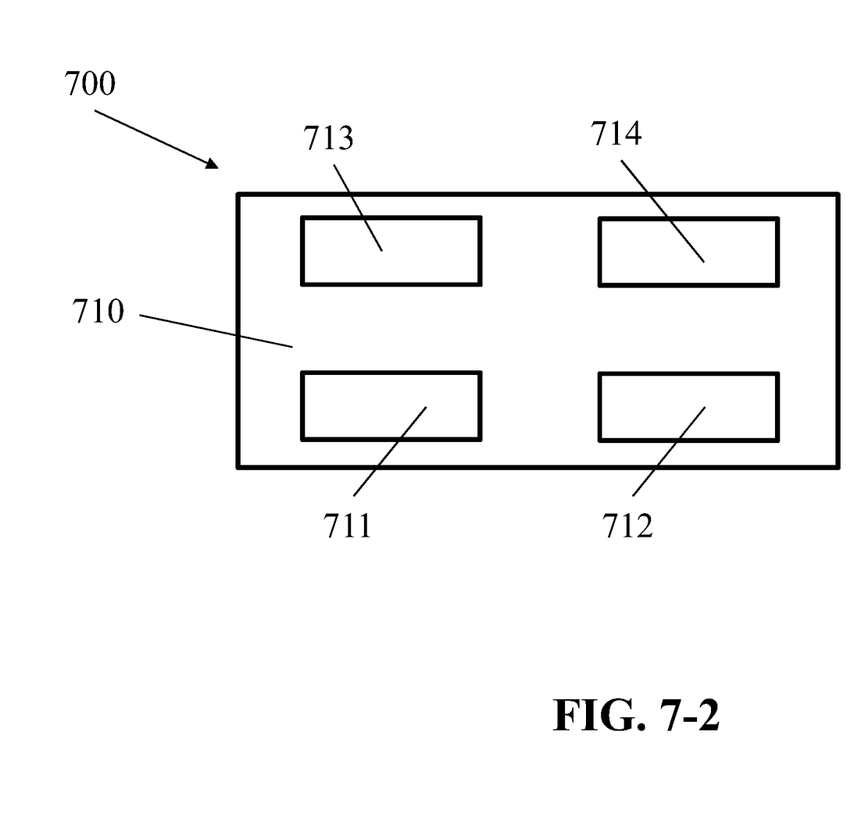

FIGS. 7-1 and 7-2 are cross-sectional and bottom views of a finished package of a circuit component containing two coupled circuit dices that can be used in the present invention. The package 700 differs from the package 600 only in that a number of coupled circuit dices 703 replace the single circuit dice 301 having top and bottom electrodes (FIG. 6, the package 600). FIG. 7-2 is the bottom view of the device terminals 711, 712, 713, and 714 of the package 700.

Figure 8:
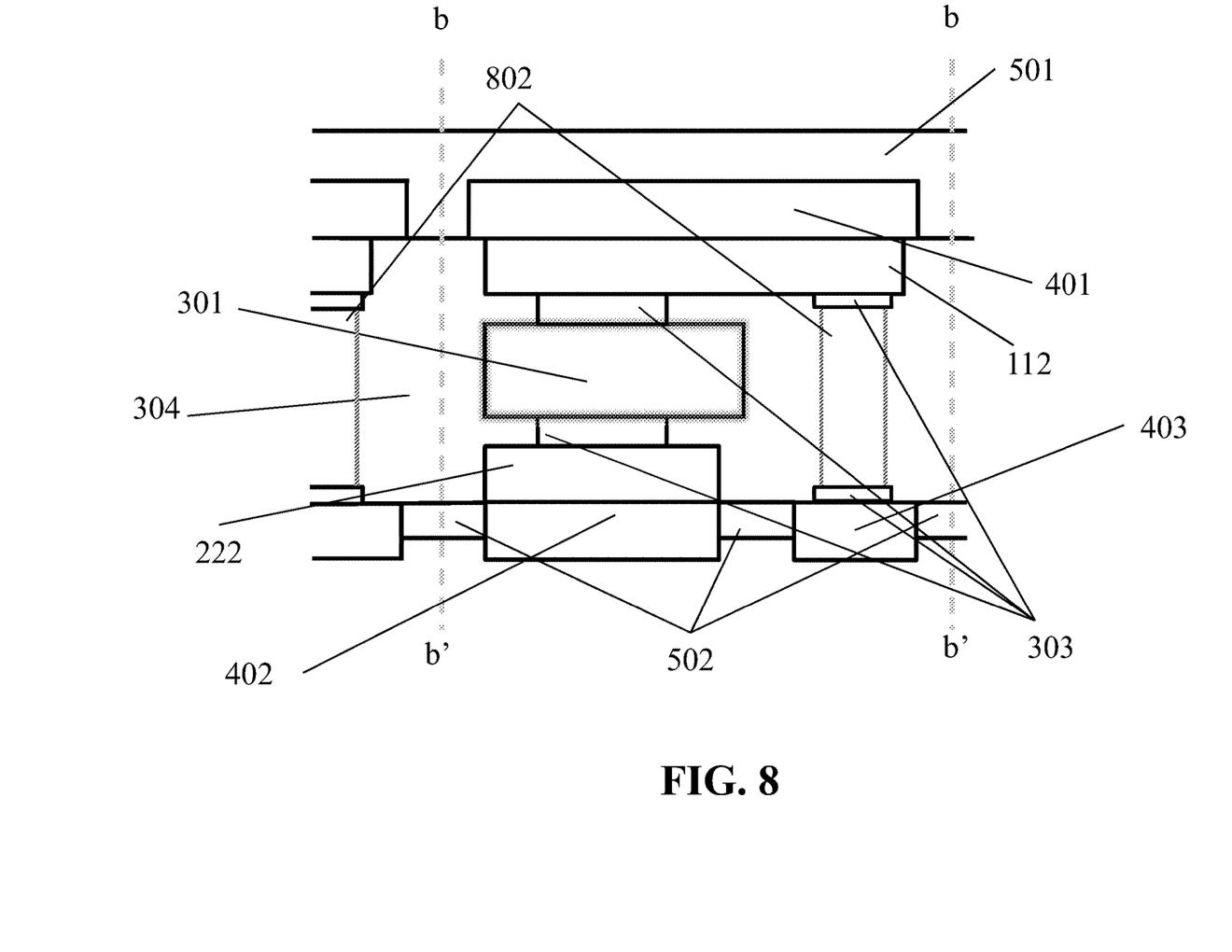
FIG. 8 schematically illustrates another preferred embodiment of a circuit component package manufactured according the method of the present invention.
Figure 14:
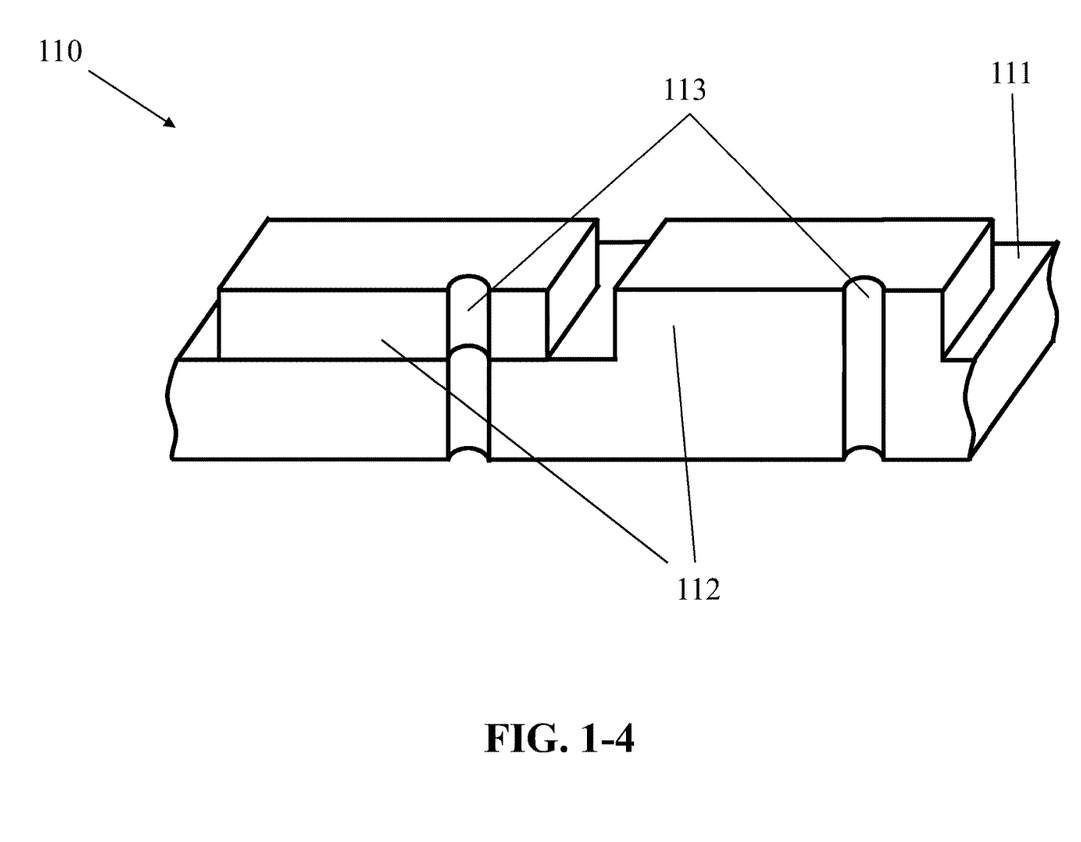

FIG. 8 schematically illustrates another preferred embodiment of a circuit component package manufactured according the method of the present invention. It should be noted that compared with the embodiments described above, where a copper rod is used to obtain form connection between the electrode above the circuit core and the independent copper bump (on the right-hand side) at the bottom of the circuit component, the embodiment of FIG. 8 shows that copper block 802 replaces the copper rods. In the package shown in FIG. 8, the copper block 802 is processed as they are the circuit dice 301. This can not only avoid the step of forming the through-holes 113 (FIGS. 1-1 to 1-4), but also increase the overall process efficiency, reduce costs, and improve the electrical and thermal conductivities of the circuit dices 301.

In addition, the copper block 802 of FIG. 8 may have a cross section in any suitable form. For example, the copper block 802 with a either circular or rectangular cross section is applicable.

Although the preferred embodiments of the present invention have been described as above, they do not limit the scope of the invention. Various alterations and modifications to the disclosure will become apparent to those skilled in the art from the description without departing from the spirit of the present invention. By way of example, in the embodiments described above, either or both of the first and second copper substrate structures 110, 220 may be replaced with a lead frame substrate. The present invention is defined by the scope of the appended claims and their legal equivalents.

That which is claimed is:

1. A method for packaging a circuit component, comprising:
    forming a first protruding pad on a first copper substrate and a through-hole in the first protruding pad;
    forming a second protruding pad on a second copper substrate and placing a circuit dice of the circuit component on the second protruding pad having a conductive paste coated thereon wherein a first electrode of the dice facing the second protruding pad;
    stacking the first copper substrate onto the second copper substrate with the first protruding pad having a conductive paste coated thereon aligned and pressing onto the circuit dice placed on the second protruding pad wherein a second electrode of the dice facing the first protruding pad;
    inserting a copper rod into the through-hole until contacting with a conductive paste coated on the second substrate;
    heat-treating the stacked structure for the circuit dice and the copper rod to form secured electrical connection with the first and second copper substrates respectively and further forming a hermetic seal in the space between the first and second copper substrates; and
    using the hermetic seal as a rigid processing structure, etching the exposed surface of the first and second copper substrates to remove the entire thickness of copper other than in the area of the first and second protruding pads and in the area other than where the copper rod connects to the second copper substrate, thereby forming the device terminals of the circuit component package.

2. The method of claim 1, wherein the circuit component is a diode.

3. The method of claim 1, wherein the at least one copper rod is a cylindrical rod.

4. The method of claim 1, wherein the at least one copper rod is polygonal rod.

5. The method of claim 1, wherein the at least one through-hole is formed by mechanical drilling.

* * * * *